United States Patent
Ikoshi et al.

(10) Patent No.: US 8,497,581 B2
(45) Date of Patent: Jul. 30, 2013

(54) SEMICONDUCTOR DEVICE AND MANUFACTURING METHOD THEREOF

(75) Inventors: Ayanori Ikoshi, Kyoto (JP); Yasuhiro Uemoto, Toyama (JP); Manabu Yanagihara, Osaka (JP); Tatsuo Morita, Kyoto (JP)

(73) Assignee: Panasonic Corporation, Osaka (JP)

( * ) Notice: Subject to any disclaimer, the term of this patent is extended or adjusted under 35 U.S.C. 154(b) by 66 days.

(21) Appl. No.: 13/220,054

(22) Filed: Aug. 29, 2011

(65) Prior Publication Data

US 2012/0001200 A1 Jan. 5, 2012

Related U.S. Application Data

(63) Continuation of application No. PCT/JP2009/007263, filed on Dec. 25, 2009.

(30) Foreign Application Priority Data

Mar. 2, 2009 (JP) ................................ 2009-047789

(51) Int. Cl.
- *H01L 23/48* (2006.01)
- *H01L 23/52* (2006.01)
- *H01L 29/40* (2006.01)
- *H01L 23/495* (2006.01)
- *H01L 23/34* (2006.01)

(52) U.S. Cl.
USPC ........... 257/773; 257/621; 257/675; 257/689; 257/718

(58) Field of Classification Search
USPC ............. 257/77, 666, 773, 190, 76, 615, 155, 257/260, 284, 613, 177, 678, 689, 706, 707, 257/711, 718, 720, 41, 670, 675, 667, 717, 257/676, 293, 621
See application file for complete search history.

(56) References Cited

U.S. PATENT DOCUMENTS

| | | | |
|---|---|---|---|
| 5,897,337 A | 4/1999 | Kata et al. | |
| 7,224,051 B2 * | 5/2007 | Farnworth et al. | 257/678 |
| 2001/0048116 A1 | 12/2001 | Standing et al. | |
| 2009/0114944 A1 * | 5/2009 | Ono et al. | 257/103 |
| 2009/0325333 A1 * | 12/2009 | Fukuchi et al. | 438/38 |

FOREIGN PATENT DOCUMENTS

| | | |
|---|---|---|
| JP | 8-102474 | 4/1996 |
| JP | 2001-015641 | 1/2001 |
| JP | 2003-086626 | 3/2003 |
| JP | 2005-354105 | 12/2005 |

* cited by examiner

Primary Examiner — Chuong A. Luu
(74) Attorney, Agent, or Firm — McDermott Will & Emery LLP (57) ABSTRACT

A semiconductor device includes: a semiconductor chip; a protective film and an insulating film sequentially stacked over the semiconductor chip, and each having openings that expose source, drain, and gate pads; a heat dissipation terminal made of a material having a higher thermal conductivity than the insulating film; connection terminals formed on the source, drain, and gate pads and surrounded by the insulating film; and a mount substrate having connection pads. The semiconductor chip has a source electrode having a plurality of source fingers, a drain electrode having a plurality of drain fingers, and a gate electrode having a plurality of gate fingers. The source, drain, and gate pads are connected to the source electrode, the drain electrode, and the gate electrode, respectively. The connection terminals are respectively connected to the connection pads. The heat dissipation terminal is in close contact with the mount substrate.

7 Claims, 6 Drawing Sheets

SEMICONDUCTOR DEVICE AND MANUFACTURING METHOD THEREOF

CROSS-REFERENCE TO RELATED APPLICATION

This is a continuation of PCT International Application PCT/JP2009/007263 filed on Dec. 25, 2009, which claims priority to Japanese Patent Application No. 2009-047789 filed on Mar. 2, 2009. The disclosures of these applications including the specifications, the drawings, and the claims are hereby incorporated by reference in their entirety.

BACKGROUND

The present disclosure relates to semiconductor devices and manufacturing methods thereof, and more particularly to semiconductor devices to which a high voltage is applied, and manufacturing methods thereof.

As electronic apparatuses have been increasingly reduced in size and weight and increased in performance, semiconductor packages that are mounted in the electronic apparatuses have been required to be reduced in size, thickness, and weight in order to implement high-density mounting on mount substrates. A semiconductor package technique called "chip scale package (CSP)" has been developed in order to reduce the size of the semiconductor packages. In the CSP, a sealing step is completed in a wafer state, and the size of semiconductor packages is the same as or slightly larger than that of individual chips separated by dicing. A semiconductor chip for the CSP has its surface covered by a protective film, and has a polyimide layer or a redistribution layer formed on the protective film, and a surface-side resin layer that seals the redistribution layer, etc. A plurality of external terminals electrically connected to the semiconductor chip are provided over the surface-side resin layer. The external terminals are bonded to lands on a mount substrate to mount the semiconductor chip on the mount substrate.

Figure 12:
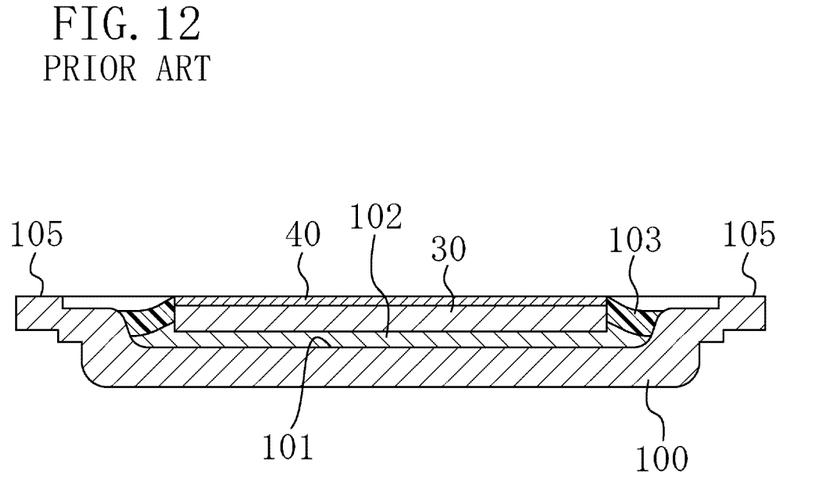
FIG. 12 is a cross-sectional view of a conventional semiconductor device.

The CSP has also been applied to power transistors for power supply circuits, etc. in order to reduce the size. For example, the following semiconductor device using the CSP is known in the art (see, e.g., Japanese Patent Publication No. 2005-354105). As shown in FIG. 12, in a conventional semiconductor device, a semiconductor chip 30 separated by dicing is sealed and accommodated in a recess of a metal frame 100 by using an epoxy resin 103. The semiconductor chip 30 has a solderable contact layer 40 on a first surface thereof, and a second surface of the semiconductor chip 30 serves as a drain electrode. The drain electrode of the chip is bonded to a bottom surface 101 of the recess of the metal frame 100 by solder 102, and the upper surface of the contact layer 40 is flush with a protruding portion 105 of the metal frame 100. Thus, the contact layer 40 and the protruding portion 105 can be connected to a contact of a mount substrate. With this configuration, a power metal oxide semiconductor (MOS) device can be compactly mounted.

SUMMARY

However, the conventional packages have the following problems when applied to power devices using wide bandgap semiconductor such as nitride semiconductor. Small, high breakdown voltage power devices can be implemented by using the wide bandgap semiconductor. In power devices using high breakdown voltage, wide bandgap semiconductor, a voltage that is applied between electrodes is significantly higher than that of power devices using silicon. Moreover, since the device size can be reduced, the distance between the electrodes is shorter than that in the silicon power devices. Thus, a high electric field exceeding a breakdown field of air concentrates on a region between the electrodes, causing air discharge between the electrodes. In particular, in lateral power devices using gallium nitride (GaN), etc. as a wide bandgap material, a high voltage is applied to the electrodes, and the distance between the electrodes can be reduced as compared to the conventional silicon power devices, whereby air discharge tends to occur. Such air discharge seriously damages the semiconductor device, and in the worst case, destroys the semiconductor device. In order to increase the breakdown voltage of the semiconductor device, it is necessary to suppress air discharge. However, in the conventional packages, no measures have been taken to suppress air discharge between the metal frame connected to the drain electrode and the gate and source electrodes.

Heat dissipation is more important in the chips having a reduced size. In particular, in the lateral power devices, the channel is formed in the semiconductor layer formed on the substrate. Thus, it is important to dissipate heat from the side of the semiconductor layer. However, in the conventional packages in which the back side of the substrate is connected to the metal frame, heat may not be sufficiently dissipated from the side of the semiconductor layer.

It is an object of the present disclosure to implement a semiconductor device having an increased breakdown voltage, in which air discharge is less likely to occur even if a high voltage is applied.

In order to achieve the above object, a semiconductor device of the present disclosure is configured to include an insulating film that surrounds a connection terminal formed on an electrode pad.

Specifically, a first example semiconductor device includes: a semiconductor chip having source, drain, and gate pads formed on its one surface; a protective film and an insulating film sequentially stacked over the semiconductor chip, and each having openings that expose the source, drain, and gate pads; a heat dissipation terminal made of a material having a higher thermal conductivity than the insulating film; connection terminals formed on the source, drain, and gate pads, and surrounded by the insulating film; and a mount substrate having connection pads, wherein the semiconductor chip has a formation substrate, a semiconductor layer formed on the formation substrate, a source electrode formed over the semiconductor layer and having a plurality of source fingers, a drain electrode formed over the semiconductor layer and having a plurality of drain fingers, and a gate electrode formed over the semiconductor layer and having a plurality of gate fingers, the source fingers and the drain fingers are alternately formed over an active region of the semiconductor layer, each of the gate fingers is formed between a corresponding pair of the source finger and the drain finger that adjoin each other, the source, drain, and gate pads are connected to the source electrode, the drain electrode, and the gate electrode, respectively, the connection terminals are respectively connected to the connection pads, and the heat dissipation terminal is in close contact with the mount substrate.

A second example semiconductor device includes: a semiconductor chip having a first ohmic pad, a second ohmic pad, a first gate pad, and a second gate pad formed on its one surface; a protective film and an insulating film sequentially stacked over the semiconductor chip, and each having openings that expose the first ohmic pad, the second ohmic pad, the first gate pad, and the second gate pad; a heat dissipation terminal made of a material having a higher thermal conductivity than the insulating film; connection terminals formed on the first ohmic pad, the second ohmic pad, the first gate pad, and the second gate pad, and surrounded by the insulating film; and a mount substrate having connection pads, wherein the semiconductor chip has a formation substrate, a semiconductor layer formed on the formation substrate, a first ohmic electrode formed over the semiconductor layer and having a plurality of first ohmic fingers, a second ohmic electrode formed over the semiconductor layer and having a plurality of second ohmic fingers, a first gate electrode formed over the semiconductor layer and having a plurality of first gate fingers, and a second gate electrode formed over the semiconductor layer and having a plurality of second gate fingers, the first ohmic fingers and the second ohmic fingers are alternately formed over an active region of the semiconductor layer, each pair of the first gate finger and the second gate finger are formed between a corresponding pair of the first ohmic finger and the second ohmic finger that adjoin each other, the first ohmic pad, the second ohmic pad, the first gate pad, and the second gate pad are connected to the first ohmic electrode, the second ohmic electrode, the first gate electrode, and the second gate electrode, respectively, the connection terminals are respectively connected to the connection pads, and the heat dissipation terminal is in close contact with the mount substrate.

In the example semiconductor device, the connection terminals are separated from each other by the insulating film. Thus, discharge is less likely to occur between the connection terminals, as compared to the case where the connection terminals are separated from each other only by air. As a result, the breakdown voltage of the semiconductor device can be increased.

BRIEF DESCRIPTION OF THE DRAWINGS

FIGS. 9A-9B show a modification of the semiconductor device of the embodiment, where FIG. 9A is a plan view, and FIG. 9B is a cross-sectional view taken along line IXb-IXb in FIG. 9A.

DETAILED DESCRIPTION

Figure 1:
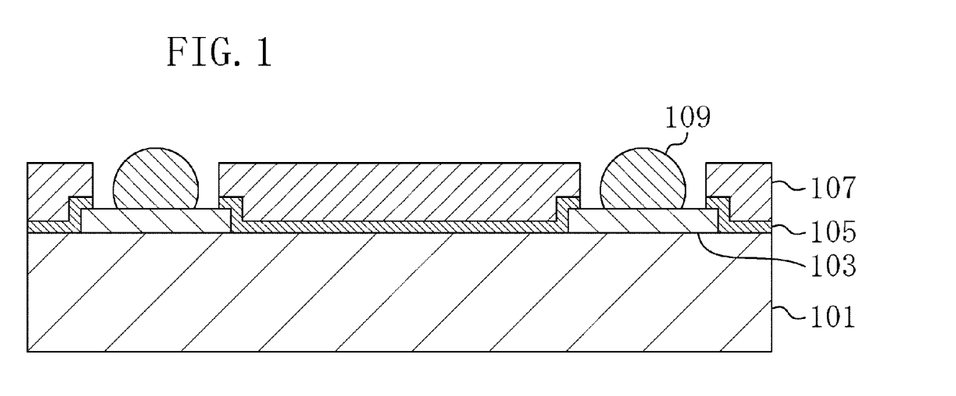
FIG. 1 is a cross-sectional view of a semiconductor device according to an embodiment.

An embodiment of the present disclosure will be described with reference to the accompanying drawings. FIG. 1 shows a cross-sectional configuration of a semiconductor device according to an embodiment of the present disclosure. As shown in FIG. 1, a semiconductor chip 101 has a plurality of electrode pads 103 on its one surface, and a protective film 105 and an insulating film 107, each having openings exposing the electrode pads 103, are sequentially stacked over the semiconductor chip 101. Connection terminals 109 are formed on the electrode pads 103, and each connection terminal 109 is surrounded by the insulating film 107.

Figure 2:
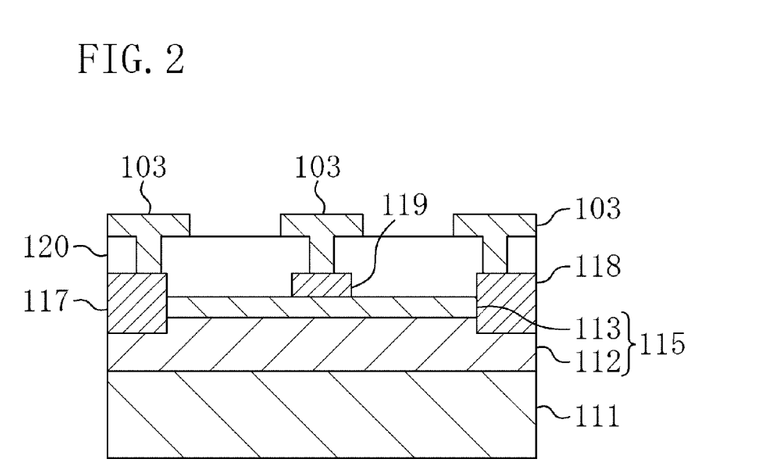
FIG. 2 is a cross-sectional view showing an example of a semiconductor chip that is used for the semiconductor device of the embodiment.

The semiconductor chip 101 may be a heterojunction field effect transistor (HFET) as shown in FIG. 2. In the case of the HFET, a semiconductor layer 115, which has a first nitride semiconductor layer 112 and a second nitride semiconductor layer 113 having a wider bandgap than the first nitride semiconductor layer 112, is formed on a formation substrate 111. A source electrode 117, a drain electrode 118, and a gate electrode 119 are formed on the semiconductor layer 115. Electrode pads 103 are respectively connected to the source electrode 117, the drain electrode 118, and the gate electrode 119. A double-gate HFET having two gate electrodes between a source electrode and a drain electrode, a field effect transistor (FET), a bipolar junction transistor (BJT), a diode, etc. may be used instead of the HFET, and a material such as silicon (Si), silicon carbide (SiC), etc. may be used.

In FIG. 2, the electrode pads 103 are formed on an interlayer insulating film 120 formed over the semiconductor layer 115. However, the interlayer insulating film 120 may be omitted in the case where the source electrode 117, the drain electrode 118, the gate electrode 119, etc. are formed integrally with the electrode pads 103. Alternatively, the electrode pads 103 may be formed over an isolation region formed in the semiconductor layer 115. In this case as well, the interlayer insulating film 120 need not necessarily be formed. The material of the electrode pads 130 is not particularly limited, but the electrode pads 130 are preferably made of at least one of aluminum (Al), titanium (Ti), nickel (Ni), palladium (Pd), platinum (Pt), and gold (Au).

The protective film 105 is preferably made of aluminum nitride (AlN) having a high thermal conductivity, in order to improve heat dissipation capability. The protective film 105 may be made of silicon nitride ($Si_3N_4$) or silicon dioxide ($SiO_2$). The protective film 105 can be formed by using a chemical vapor deposition (CVD) method, etc. The insulating film 107 may be made of any insulating material having a higher breakdown field than air (0.035 MV/cm). For example, the insulating film 107 can be made of an organic insulating film material such as polyimide (2.5 MV/cm), benzocyclobutene (BCB, 7 MV/cm), etc. In this case, the insulating film 107 can be formed by a spin coating method, a screen printing method, etc. Alternatively, the insulating film 107 may be made of an inorganic insulating film material such as SiN (4.6 MV/cm), AlN (5.7 MV/cm), etc.

The openings exposing the electrode pads 103 can be formed by a dry etching method or a wet etching method. Using a photosensitive resin material as the insulating film 108 allows the openings to be formed by exposure and development. The connection terminals 109 can be solder balls, a solder layer, Au bumps, a metal layer, etc. The connection terminals 109 are the portions to be connected to connection pads on a mount substrate when the semiconductor device is mounted on the mount substrate. Thus, the connection terminals 109 may be deformed by melting, etc. when the semiconductor device is mounted on the mount substrate. FIG. 1 shows an example in which the connection terminals 109 have not been connected to the connection pads. The connection terminals 109 can be formed by a ball mounter, a screen printing method, a plating method, a stud bump method, etc.

The connection terminals 109 may be formed either after forming the openings in the protective film 105 and the insulating film 107, or before forming at least one of the protective film 105 and the insulating film 107.

The semiconductor chip is typically formed by forming a plurality of semiconductor elements on a wafer and dicing the wafer into individual chips. The semiconductor elements can be efficiently inspected by performing wafer-level inspection before dicing. However, in conventional semiconductor chips having no insulating film 107, air discharge may occur between the electrode pads if a high voltage is applied to the electrode pads at the wafer level in a dielectric strength test. Thus, the dielectric strength test need be conducted after mounting the semiconductor chip on the mount substrate. However, the semiconductor device of the present embodiment has the insulating film 107 having a higher breakdown field than air. Thus, the wafer can be diced into individual chips after the dielectric strength test is conducted at the wafer level, whereby manufacturing efficiency is improved. Note that if the insulating film 107 has already been formed, the dielectric strength test can be conducted before forming the connection terminals 109.

Figure 3:
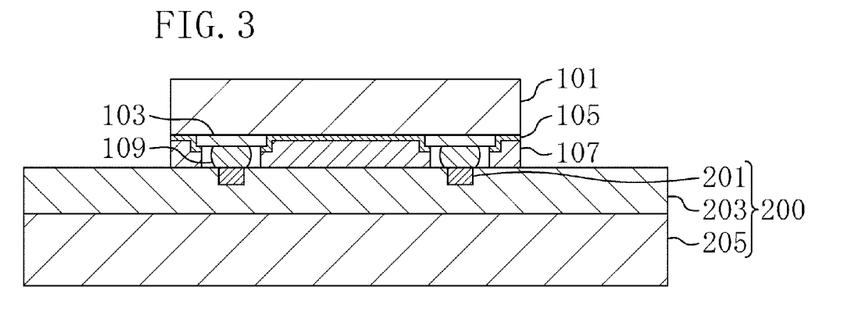
FIG. 3 is a cross-sectional view showing a state where the semiconductor device of the embodiment is mounted on a mount substrate.

As shown in FIG. 3, in the state where the semiconductor device of the present embodiment is mounted on a mount substrate 200, the insulating film 107 closely contacts the upper surface of the mount substrate 200. Thus, discharge is less likely to occur between the connection terminals 109 and thus the breakdown voltage of the semiconductor device can be increased, as compared to the case where there is an air layer between the connection terminals 109. In the case where a resin is enclosed between the semiconductor chip 101 and the mount substrate 200, resin sealing may not be perfect due to the flow property of the resin, etc., and a void may remain and serve as a passage of discharge. In this case, discharge occurs in the portion where the resin sealing is not perfect. However, since the insulating film 107 is formed in advance in the semiconductor device of the present embodiment, such a void serving as a passage of discharge is not formed between the connection terminals 109. If the insulating film 107 is not provided, mechanical strength is not high enough, and thus resin sealing is required for practical applications. However, since the semiconductor device of the present embodiment has the insulating film 107, the mechanical strength can be ensured even without resin sealing. Note that in order to further improve the mechanical strength, resin sealing may be performed in the semiconductor device of the present embodiment by using a thermosetting or photocurable resin. Using the photocurable resin for the resin sealing can improve reliability against heat, because the photocurable resin is not subjected to heat history like the thermosetting resin, and the possibility of cracks in the semiconductor chip 101 and the connection terminals 109, etc. can be reduced.

Figure 4:
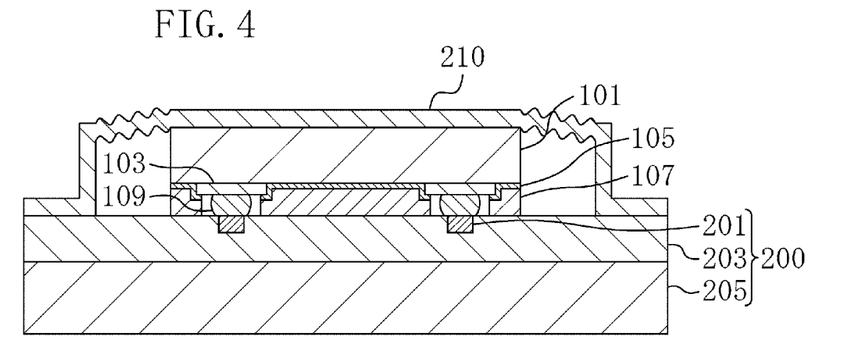
FIG. 4 is a cross-sectional view showing a modification of the state where the semiconductor device of the embodiment is mounted on the mount substrate.

As shown in FIG. 4, the semiconductor chip 101 may be pressed against the mount substrate 200 by using a metal frame 210, etc. Pressing the semiconductor chip 101 by the frame 210 can increase adhesion between the insulating film 107 and the mount substrate 200.

The mount substrate 200 shown in FIG. 3 or 4 has an interconnect portion 203 and a heat dissipation portion 205. Connection pads 201 and interconnects (not shown) are formed in the interconnect portion 203. The connection pads 201 and the interconnects are made of a metal having a low volume resistivity such as copper (Cu), Al, Au, etc. The connection terminals 109 are connected to the connection pads 201, and the interconnects are connected to the connection pads 201. The interconnects can be made of a metal having a volume resistivity of $2 \times 10^{-7}$ μm or less. The heat dissipation portion 205 can be made of Cu having a thermal conductivity as high as 400 W/mK, or may be made of Al, etc. Note that the configuration of the mount substrate shown in FIG. 3 is by way of example only, and the mount substrate may have other configurations.

FIG. 1 shows an example in which the upper ends of the connection terminals 109 protrude beyond the upper surface of the insulating film 107. Connection between the connection terminals 109 and the connection pads 201 is facilitated by configuring the connection terminals 109 so that the upper ends thereof protrude beyond the upper surface of the insulating film 103 by about 1 μm to 50 μm. Moreover, such protrusion of the upper ends of the connection terminals 109 still allows the insulating film 107 to sufficiently closely contact the mount substrate 200, and does not cause problems when conducting inspection before mounting. However, as long as the connection terminals 109 can be connected to the connection pads 201, the upper ends of the connection terminals 109 may be flush with, or lower than the upper surface of the insulating film 107.

In the semiconductor device of the present embodiment, since each of the connection terminals 109 is surrounded by the insulating film 107 having a higher breakdown field than air, air discharge is less likely to occur between the connection terminals 109. Moreover, the semiconductor device is mounted so that the insulating film 107 faces the mount substrate 200. Thus, heat can be efficiently dissipated from the side of the semiconductor layer where a larger amount of heat is generated.

Figure 5:
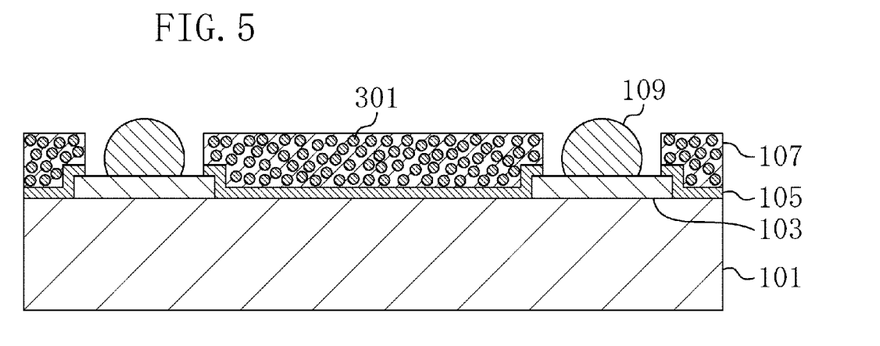
FIG. 5 is a cross-sectional view showing a modification of the semiconductor device of the embodiment.

As shown in FIG. 5, a heat dissipation filler 301 may be dispersed in the insulating film 107. This further improves heat dissipation capability of the semiconductor device. In particular, in the case of the HFET using nitride semiconductor, the channel where heat is generated is located on the surface side of the semiconductor layer. Dispersing the heat dissipation filler 301 in the insulating film 107 is very effective because it can improve heat dissipation efficiency from the surface side of the semiconductor layer. The filler 301 may be any material having a higher thermal conductivity than the insulating film 107. For example, silica, alumina, boron nitride, magnesia, aluminum nitride, silicon nitride, diamond, etc. can be used as the filler 301. The mean particle size of the filler can be about 0.1 μm to 10 μm. The mean particle size of the filler 301 may be increased if the insulating film 107 has a large thickness.

Figure 6:
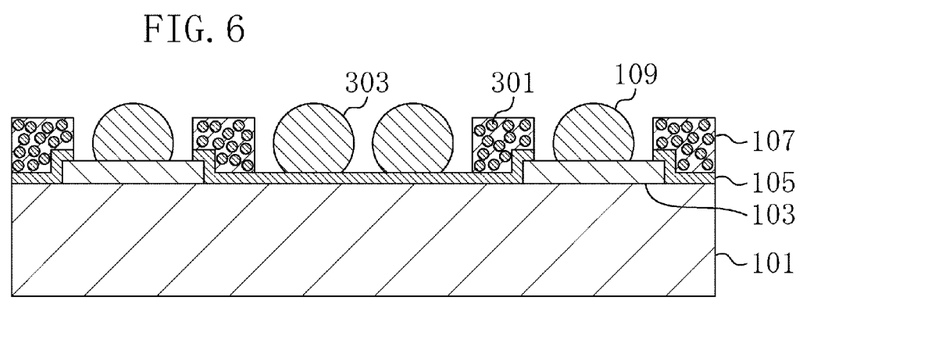
FIG. 6 is a cross-sectional view showing a modification of the semiconductor device of the embodiment.

Heat dissipation terminals 303 may further be provided as shown in FIG. 6. In the case where the insulating film 107 is not provided and there is a metal between the connection terminals 109, air discharge is more likely to occur, and the breakdown voltage is significantly reduced. However, since the insulating film 107 can significantly increase the breakdown field between the connection terminals 109, forming the heat dissipation terminals 303 of a metal between the connection terminals 109 does not reduce the breakdown voltage. For example, if the insulating film 107 is a BCB film having a breakdown field of about 7 MV/cm, and a voltage of 800 V is applied between the connection terminals 109, the insulating film formed between the connection terminals 109 need only have a width of 1.2 μm or more. Much the same applies to the case where the insulating film 107 is made of polyimide.

The heat dissipation terminals 303 can be formed in a recess formed in the insulating film 107. It is preferable that the insulating film 107 be also present between the heat dissipation terminal 303 and the connection terminal 109. It is also preferable that the heat dissipation terminals 303 be formed on the protective film 105. The heat dissipation terminals 303 can be easily formed by using the same material as the connection terminals 109. Forming the heat dissipation terminals 303 from a metal having a thermal conductivity of 200 W/mK or more, such as Cu, Au, Al, silver (Ag), etc., can further enhance the heat dissipation efficiency. The heat dissipation terminals 303 may be made of any insulating material having a thermal conductivity of 200 W/mK or more, such as AlN, diamond, etc. Using the insulating material further reduces the possibility of discharge between the connection terminals 109. Although the heat dissipation terminals 303 can further improve the heat dissipation efficiency when used with the filler 301, the filler 301 is not necessarily be provided.

Figure 7:
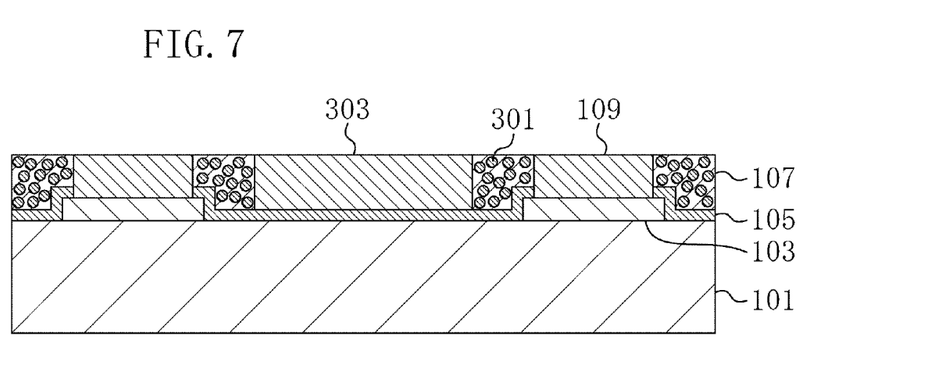
FIG. 7 is a cross-sectional view showing a modification of the semiconductor device of the embodiment.
Figure 8:
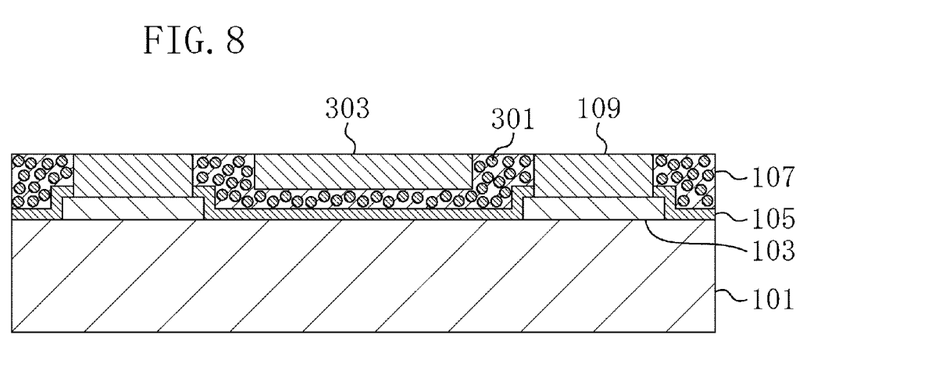
FIG. 8 is a cross-sectional view showing a modification of the semiconductor device of the embodiment.

Providing the connection terminals 109 and the heat dissipation terminal 303 in close contact with the insulating film 107 as shown in FIG. 7 can further improve the heat dissipation capability. In this case, as shown in FIG. 8, leaving the insulating film 107 on the bottom surface of the recess that forms the heat dissipation terminal 303 makes it easier to ensure insulation between the heat dissipation terminal 303 and the semiconductor chip 101. This is advantageous in the case where the semiconductor chip 101 includes a multi-finger HFET.

Figure 9A:
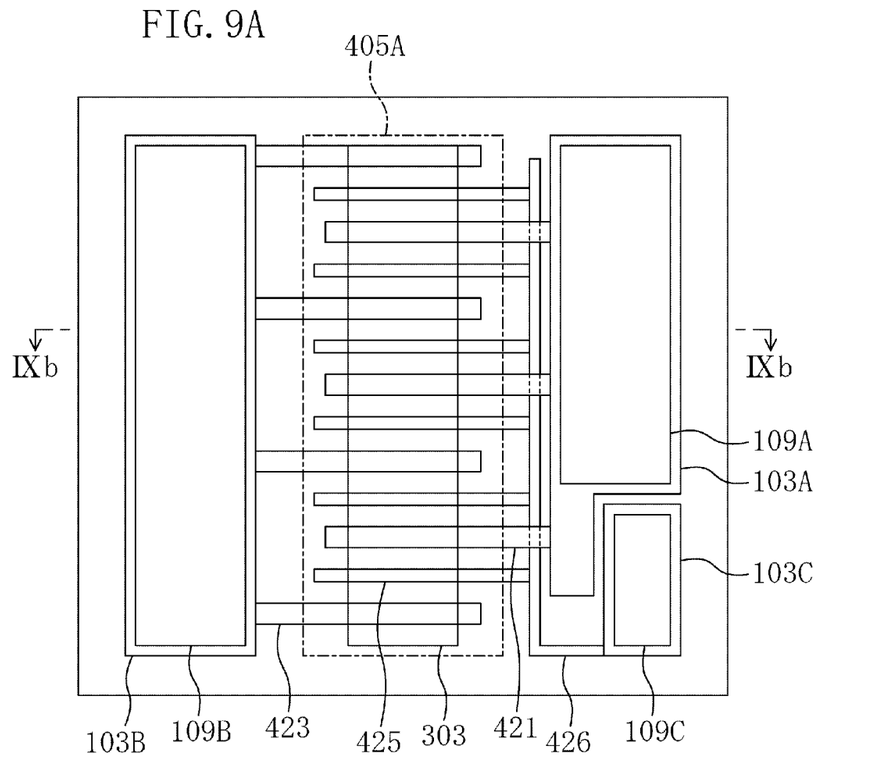
Figure 9B:
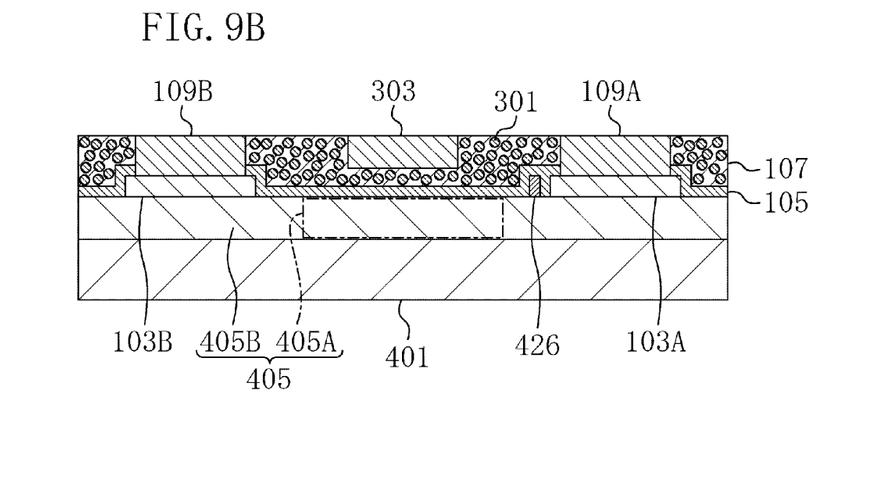

FIGS. 9A-9B show a semiconductor device including a semiconductor chip including a multi-finger HFET, where FIG. 9A shows a planar configuration, and FIG. 9B shows a cross-sectional configuration taken along line IXb-IXb in FIG. 9A. Note that the protective film 105 and the insulating film 107 are not shown in FIG. 9A. As shown in FIG. 9B, the semiconductor chip has a semiconductor layer stack 405 formed on a formation substrate 401. The semiconductor layer stack 405 is, e.g., a stack of a GaN layer and an AlGaN layer, and has an isolation region 405B having an increased resistance by ion implantation, etc., and an active region 405A. A source electrode, a drain electrode, and a gate electrode are formed over the active region 405A. The source electrode is formed by a plurality of source fingers 421, the drain electrode is formed by a plurality of drain fingers 423, and the gate electrode is formed by a plurality of gate fingers 425.

A source electrode pad 103A connected to the source fingers 421, a drain electrode pad 103B connected to the drain fingers 423, and a gate electrode pad 103C connected to the gate fingers 425 via a gate line 426 are formed on the isolation region 405B. The protective film 105 and the insulating film 107 are sequentially formed so as to expose the source electrode pad 103A, the drain electrode pad 103B, and the gate electrode pad 103C. A source connection terminal 109A, a drain connection terminal 109B, and a gate connection terminal 109C are formed on the source electrode pad 103A, the drain electrode pad 103B, and the gate electrode pad 103C, respectively. The source electrode pad 103A and the gate electrode pad 103C are located on the opposite side of the active region 405A from the drain electrode pad 103B. A recess is formed over the active region 405A in the insulating film 107, and the heat dissipation terminal 303 is formed in the recess.

In the semiconductor chip, the largest amount of heat is generated in the active region 405A. Thus, forming the heat dissipation terminal 303 over the active region 405A can improve the heat dissipation efficiency. However, since the source electrode, the drain electrode, and the gate electrode are formed over the active region 405A, and discharge may occur between these electrodes and the heat dissipation terminal 303. Leaving the insulating film 107 below the heat dissipation terminal 303 as shown in FIG. 9B can reduce the possibility of discharge between the heat dissipation terminal 303 and the electrodes.

Figure 10:
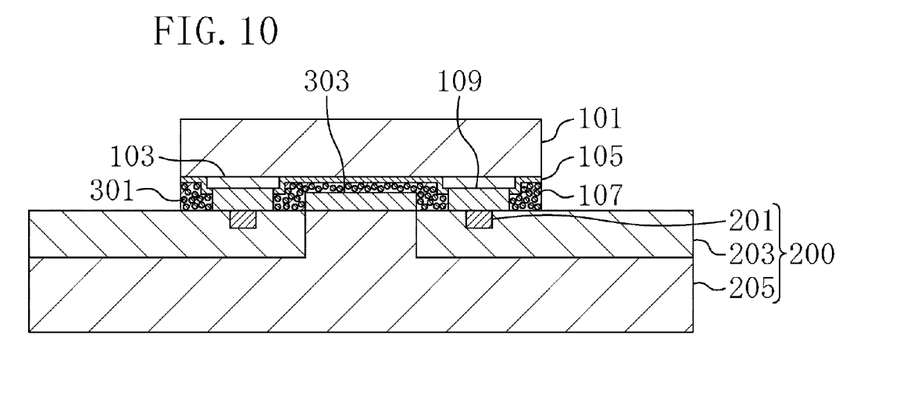
FIG. 10 is a cross-sectional view showing a modification of the state where the semiconductor device of the embodiment is mounted on the mount substrate.

As shown in FIG. 10, the heat dissipation terminal 303 may be directly connected to the heat dissipation portion 205. This can further enhance the heat dissipation efficiency.

Note that the source electrode pad 103A, the drain electrode pad 103B, and the gate electrode pad 103C may either be formed directly on the isolation region 405B, or formed on the isolation region 405B with an insulating film interposed therebetween.

Figure 11:
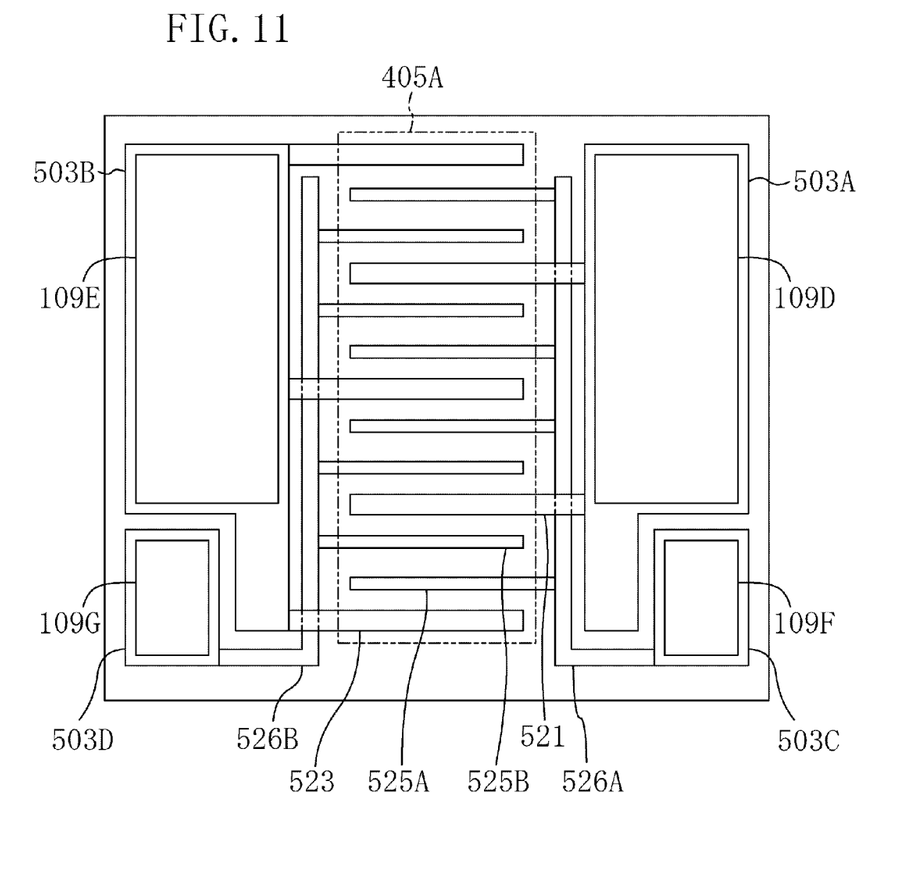
FIG. 11 is a plan view showing a modification of the semiconductor device of the embodiment.

As shown in FIG. 11, a similar configuration may be implemented even in a double-gate HFET in which a first gate electrode finger 525A and a second gate electrode finger 525B are provided between each pair of a first ohmic electrode finger 521 and a second ohmic electrode finger 523 that adjoin each other. In this case, a first connection terminal 109D can be formed on a first ohmic electrode pad 503A connected to the first ohmic electrode fingers 521, and a second connection terminal 109E can be formed on a second ohmic electrode pad 503B connected to the second ohmic electrode fingers 523. Moreover, a third connection terminal 109F can be formed on a first gate electrode pad 503C connected to the first gate electrode fingers 525A via a first gate line 526A, and a fourth connection terminal 109G can be formed on a second gate electrode pad 503D connected to the second gate electrode fingers 525B via a second gate line 526B.

As described above, the semiconductor device and the manufacturing method thereof according to the present disclosure are capable of implementing semiconductor devices having an increased breakdown voltage, in which air discharge is less likely to occur even if a high voltage is applied, and in particular, are useful as semiconductor devices for power applications such as power sources, etc., manufacturing methods thereof, etc.

What is claimed is:
1. A semiconductor device, comprising:
a semiconductor chip having a first ohmic pad, a second ohmic pad, a first gate pad, and a second gate pad formed on its one surface;
a protective film and an insulating film sequentially stacked over the semiconductor chip, and each having openings that expose the first ohmic pad, the second ohmic pad, the first gate pad, and the second gate pad;
a heat dissipation terminal made of a material having a higher thermal conductivity than the insulating film;
connection terminals formed on the first ohmic pad, the second ohmic pad, the first gate pad, and the second gate pad, and surrounded by the insulating film; and
a mount substrate having connection pads, wherein
the semiconductor chip has a formation substrate, a semiconductor layer formed on the formation substrate, a first ohmic electrode formed over the semiconductor layer and having a plurality of first ohmic fingers, a second ohmic electrode formed over the semiconductor layer and having a plurality of second ohmic fingers, a first gate electrode formed over the semiconductor layer and having a plurality of first gate fingers, and a second gate electrode formed over the semiconductor layer and having a plurality of second gate fingers,
the first ohmic fingers and the second ohmic fingers are alternately formed over an active region of the semiconductor layer, each pair of the first gate finger and the second gate finger are formed between a corresponding pair of the first ohmic finger and the second ohmic finger that adjoin each other, the first ohmic pad, the second ohmic pad, the first gate pad, and the second gate pad are connected to the first ohmic electrode, the second ohmic electrode, the first gate electrode, and the second gate electrode, respectively, the connection terminals are respectively connected to the connection pads, and the heat dissipation terminal is in close contact with the mount substrate.

2. The semiconductor device of claim 1, wherein the semiconductor layer is made of nitride semiconductor.

3. The semiconductor device of claim 1, wherein the semiconductor layer is made of silicon carbide.

4. The semiconductor device of claim 1, wherein the protective film is made of aluminum nitride.

5. The semiconductor device of claim 1, wherein the insulating film is made of polybenzoxazole.

6. The semiconductor device of claim 1, wherein the insulating film is made of polyimide.

7. The semiconductor device of claim 1, wherein the insulating film is made of benzocyclobutene.

* * * * *